(12) United States Patent
Kim et al.

(10) Patent No.: US 10,504,563 B1
(45) Date of Patent: Dec. 10, 2019

(54) METHODS AND APPARATUSES OF DRIVER CIRCUITS WITHOUT VOLTAGE LEVEL SHIFTERS

(71) Applicant: MICRON TECHNOLOGY, INC., Boise, ID (US)

(72) Inventors: Tae H. Kim, Boise, ID (US); Byung S. Moon, Plano, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/001,743

(22) Filed: Jun. 6, 2018

(51) Int. Cl.
*G11C 5/14* (2006.01)
*G11C 8/10* (2006.01)
(52) U.S. Cl.
CPC ............... *G11C 5/147* (2013.01); *G11C 8/10* (2013.01)
(58) Field of Classification Search
CPC .................... G11C 5/147; G11C 8/10
See application file for complete search history.

(56) References Cited

U.S. PATENT DOCUMENTS 6,181,606 B1 * 1/2001 Choi ............... G11C 16/08
365/185.23

* cited by examiner

*Primary Examiner* — Mohammed A Bashar
(74) *Attorney, Agent, or Firm* — Dorsey & Whitney LLP

(57) ABSTRACT

Methods and apparatuses are provided for driver circuits without voltage level shifters. An example apparatus includes a semiconductor device including a row decoder circuit that includes a driver circuit and a switching circuit. The driver circuit is configured to receive an input signal having a first logical value, a first voltage signal, and a configurable power signal. The driver circuit is further configured to provide an output signal having the first logical value based on the first signal having the first logical value. A voltage level of the input signal is based on the first voltage signal and a voltage level the output signal is based on the configurable voltage signal. The switching circuit is configured to receive the first voltage signal and a second voltage signal and to provide the configurable voltage signal having a voltage level of one of the first voltage signal or the second voltage signal.

8 Claims, 5 Drawing Sheets

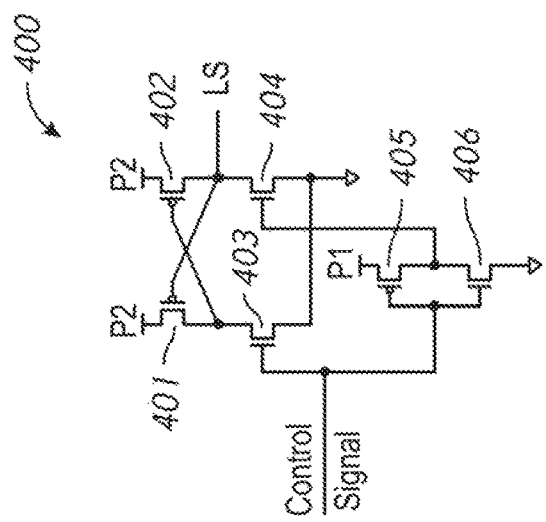
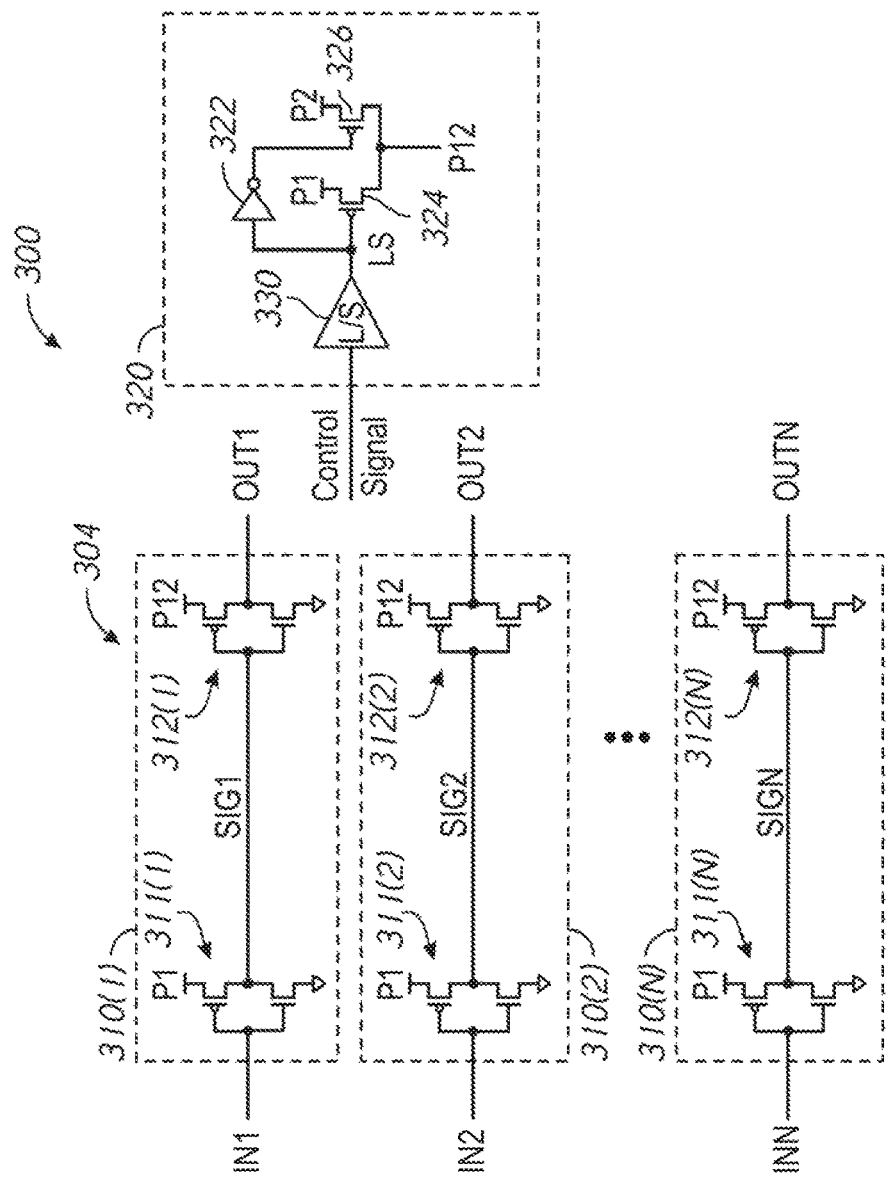
FIG. 4
FIG. 3

METHODS AND APPARATUSES OF DRIVER CIRCUITS WITHOUT VOLTAGE LEVEL SHIFTERS

BACKGROUND

High data reliability, high speed of memory access, and reduced chip size are features that are demanded from semiconductor memory. In recent years, there has been an effort to further increase the speed of memory access.

Conventional semiconductor devices include many different circuits that operate at different voltage levels, and as circuitry continues toward reduction in size, precision and accuracy of operation voltages used within the semiconductor device becomes even more critical to reliable operation. Often, the internal voltages are derived from a reference voltage provided to the semiconductor device using internal voltage generator circuitry. Some internal voltages are more efficiently generated than other internal voltages. Due to a desire for smaller circuitry and lower power consumption, some circuitry may operate at a lower voltage than other circuitry. Driver circuits may be used to provide a signal from lower voltage circuitry to higher voltage circuitry. The driver circuits may each include voltage level shifters to bridge the voltage difference gap, adding additional circuitry to each driver circuit. The extra circuitry consumes available area and consumes additional power.

BRIEF DESCRIPTION OF THE DRAWINGS

FIG. 3 is a circuit diagram of voltage shift driver circuitry configured to shift voltage levels of output signals in accordance with an embodiment of the present disclosure.

FIG. 4 is a circuit diagram of voltage level shifter circuit a in accordance with an embodiment of the present disclosure.

DETAILED DESCRIPTION OF THE EMBODIMENTS

Various embodiments of the present disclosure will be explained below in detail with reference to the accompanying drawings. The following detailed description refers to the accompanying drawings that show, by way of illustration, specific aspects and embodiments of the disclosure. The detailed description includes sufficient detail to enable those skilled in the art to practice the embodiments of the disclosure. Other embodiments may be utilized, and structural, logical and electrical changes may be made without departing from the scope of the present disclosure. The various embodiments disclosed herein are not necessary mutually exclusive, as some disclosed embodiments can be combined with one or more other disclosed embodiments to form new embodiments.

Figure 1:
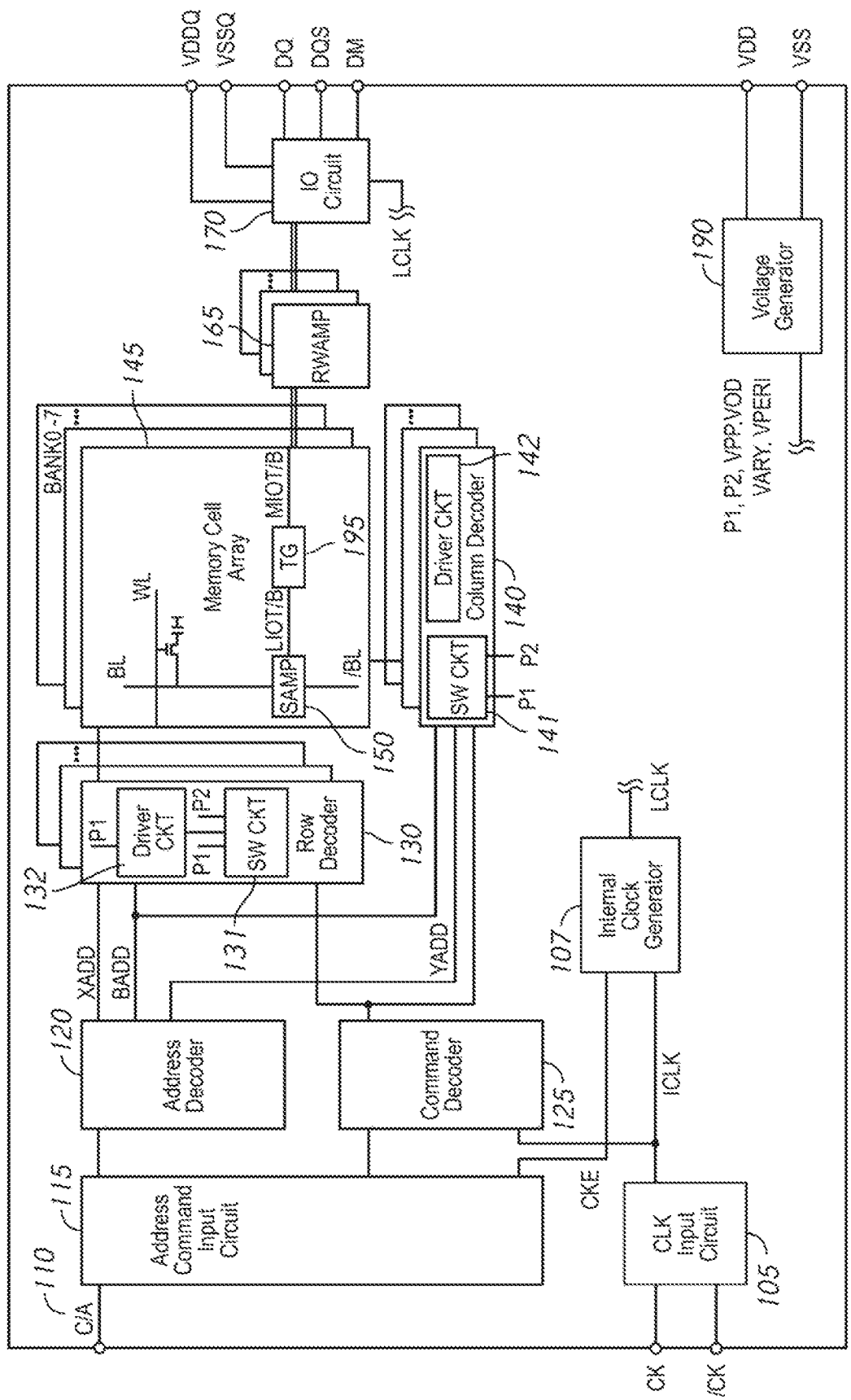
FIG. 1 is a schematic block diagram of a semiconductor device, in accordance with an embodiment of the present disclosure.

FIG. 1 is a schematic block diagram of a semiconductor device 100, in accordance with an embodiment of the present disclosure. The semiconductor device 100 may include a clock input circuit 105, an internal clock generator 107, a timing generator 109, an address command input circuit 115, an address decoder 120, a command decoder 125, a plurality of row (e.g., first access line) decoders 130, a memory cell array 145 including sense amplifiers 150 and transfer gates 195, a plurality of column (e.g., second access line) decoders 140, a plurality of read/write amplifiers 165, an input/output (I/O) circuit 170, and a voltage generator 190. The semiconductor device 100 may include a plurality of external terminals including address and command terminals coupled to command/address bus 110, clock terminals CK and /CK, data terminals DQ, DQS, and DM, and power supply terminals VDD, VSS, VDDQ, and VSSQ. The terminals and signal lines associated with the command/address bus 110 may include a first set of terminals and signal lines that are configured to receive the command signals and a separate, second set of terminals and signal lines that configured to receive the address signals, in some examples. In other examples, the terminals and signal lines associated with the command and address bus 110 may include common terminals and signal lines that are configured to receive both command signal and address signals. The semiconductor device may be mounted on a substrate, for example, a memory module substrate, a mother board or the like.

The memory cell array 145 includes a plurality of banks BANK0-N, where N is a positive integer, such as 3, 7, 15, 31, etc. Each bank BANK0-N may include a plurality of word lines WL, a plurality of bit lines BL, and a plurality of memory cells MC arranged at intersections of the plurality of word lines WL and the plurality of bit lines BL. The selection of the word line WL for each bank BANK0-N is performed by a corresponding row decoder 130 and the selection of the bit line BL is performed by a corresponding column decoder 140. The row decoder 130 may include a plurality of driver circuits 132 to drive voltages on the word lines WL. Similarly, the column decoder 140 may include a plurality of driver circuits 142 to drive voltages on the bit lines BL. In some examples, circuitry of the address decoder 120 may operate using lower voltage levels than circuitry of the memory cell array 145. Correspondingly, the XADD and YADD signals from the address decoder 120 may have lower voltages (e.g., voltage P1) than a voltage (e.g., voltage P2) of signals provided from the row decoder 130 and the column decoder 140 to the memory cell array 145. The driver circuits 132 and the driver circuits 142 may be configured to step-up or shift a voltage level P1 of the XADD or YADD signals, respectively, to provide a voltage P2 on the output signals to the memory cell array 145. Rather than including an individual voltage level shift circuit within each of the plurality of driver circuits 132 and 142, the row decoder 130 may include switching circuit(s) 131 and the column decoder 140 may include switching circuit(s) 141. The switching circuit(s) 131 and 141 may provide a configurable power signal P12 to the driver circuits 132 and 142 that transitions from a P1 voltage to a P2 voltage based on a control signal. The control signal may be provided by the address decoder 120, the command decoder 125, or some other circuitry of the semiconductor device 100. The switching circuit(s) 131 may include a single switching circuit coupled to each of the plurality of driver circuits 132, in some examples. In other examples, the switching circuit(s) 131 may include a plurality of switching circuits, with each individual switching circuits coupled to a group of the plurality of driver circuits 132. Similarly, the switching circuit(s) 141 may include a single switching circuit coupled to each of the plurality of driver circuits 142, in some examples. In other examples, the switching circuit(s) 141 may include a plurality of switching circuits, with each individual switching circuits coupled to a group of the plurality of driver circuits 142. The switching circuit(s) 131 and the driver circuits 132 may comprise first voltage shift driver circuitry and the switching circuit(s) 141 and the driver circuits 142 may comprise second voltage shift driver circuitry, in some examples. In some examples, each of the plurality of driver circuits 131 and each of the plurality of driver circuits 142 may include a pair of serially coupled inverters, with a first inverter designed to operate at the P1 voltage level and a second inverter designed to operate at the P2 voltage level. The plurality of sense amplifiers 150 are located for their corresponding bit lines BL and coupled to at least one respective local I/O line further coupled to a respective one of at least two main I/O line pairs, via transfer gates TG 195, which function as switches. While FIG. 1 depicts only the row decoder 130 and the column decoder 140 as having the driver circuits 132 and 142 and the switching circuits 131 and 141, other circuitry of the semiconductor device 100 may include similar driver and switching circuits, such as the sense amplifiers, the read/write amplifiers 165, the I/O circuit 170, etc., without departing from the scope of the disclosure.

The address/command input circuit 115 may receive an address signal and a bank address signal from outside at the command/address terminals via the command/address bus 110 and transmit the address signal and the bank address signal to the address decoder 120. The address decoder 120 may decode the address signal received from the address/command input circuit 115 and provide a row address signal XADD to the row decoder 130, and a column address signal YADD to the column decoder 140. The address decoder 120 may also receive the bank address signal and provide the bank address signal BADD to the row decoder 130 and the column decoder 140.

The address/command input circuit 115 may receive a command signal from outside, such as, for example, a memory controller 105 at the command/address terminals via the command/address bus 110 and provide the command signal to the command decoder 125. The command decoder 125 may decode the command signal and provide generate various internal command signals. For example, the internal command signals may include a row command signal to select a word line, a column command signal, such as a read command or a write command, to select a bit line.

Accordingly, when a read command is issued and a row address and a column address are timely supplied with the read command, read data is read from a memory cell in the memory cell array 145 designated by the row address and the column address. The read/write amplifiers 165 may receive the read data DQ and provide the read data DQ to the IO circuit 170. The IO circuit 170 may provide the read data DQ to outside via the data terminals DQ, DQS and DM together with a data strobe signal at DQS and a data mask signal at DM. Similarly, when the write command is issued and a row address and a column address are timely supplied with the write command, and then the input/output circuit 170 may receive write data at the data terminals DQ, DQS, DM, together with a data strobe signal at DQS and a data mask signal at DM and provide the write data via the read/write amplifiers 165 to the memory cell array 145. Thus, the write data may be written in the memory cell designated by the row address and the column address.

Turning to the explanation of the external terminals included in the semiconductor device 100, the clock terminals CK and /CK may receive an external clock signal and a complementary external clock signal, respectively. The external clock signals (including complementary external clock signal) may be supplied to a clock input circuit 105. The clock input circuit 105 may receive the external clock signals and generate an internal clock signal ICLK. The clock input circuit 105 may provide the internal clock signal ICLK to an internal clock generator 107. The internal clock generator 107 may generate a phase controlled internal clock signal LCLK based on the received internal clock signal ICLK and a clock enable signal CKE from the address/command input circuit 115. Although not limited thereto, a DLL circuit may be used as the internal clock generator 107. The internal clock generator 107 may provide the phase controlled internal clock signal LCLK to the IO circuit 170 and a timing generator 109. The IO circuit 170 may use the phase controller internal clock signal LCLK as a timing signal for determining an output timing of read data. The timing generator 109 may receive the internal clock signal ICLK and generate various internal clock signals.

The power supply terminals may receive power supply voltages VDD and VSS. These power supply voltages VDD and VSS may be supplied to a voltage generator circuit 190. The voltage generator circuit 190 may generate various internal voltages, VPP, VOD, VARY, VPERI, P1, P2, and the like based on the power supply voltages VDD and VSS. The internal voltage VPP, P1, and P2 are mainly used in the row decoder 130 and column decoder 140, the internal voltages VOD and VARY are mainly used in the sense amplifiers 150 included in the memory cell array 145, and the internal voltage VPERI is used in many other circuit blocks. In some examples, voltages P1 and P2 may be equal to a respective one of the internal voltages VPP, VOD, VARY, VPERI. The IO circuit 170 may receive the power supply voltages VDD and VSSQ. For example, the power supply voltages VDDQ and VSSQ may be the same voltages as the power supply voltages VDD and VSS, respectively. However, the dedicated power supply voltages VDDQ and VSSQ may be used for the IO circuit 170.

Figure 2:
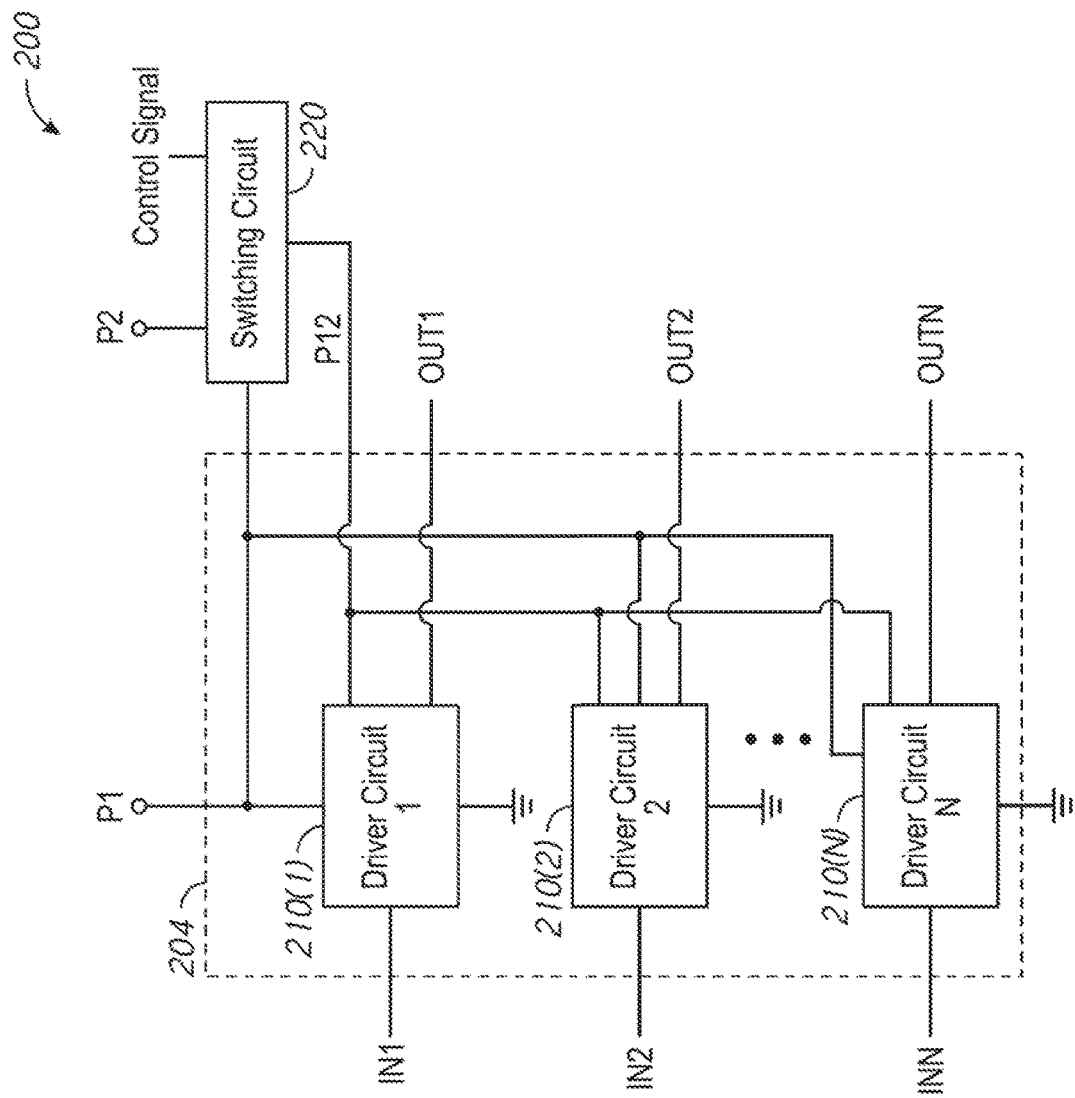
FIG. 2 is a block diagram of voltage shift driver circuitry configured to shift voltage levels of output signals in accordance with an embodiment of the present disclosure.

FIG. 2 is a block diagram of voltage shift driver circuitry 200 configured to shift voltage levels of output signals in accordance with an embodiment of the present disclosure. The switching circuit(s) 131 and the driver circuits 132 and/or the switching circuit(s) 141 and the driver circuits 142 of FIG. 1 may implement the voltage shift driver circuitry 200, in some examples. The voltage shift driver circuitry 200 may include a driver circuits 204 coupled to a switching circuit 220.

The driver circuits 204 includes individual drivers 210(1)-(N). The drivers 210(1)-(N) are each configured to receive a respective one of the input signals IN1-INN and to provide a respective one of the output signals OUT1-OUTN. Voltage levels of the input signals IN1-IN and the output signals OUT1-OUTN may be different in some examples. Thus, the drivers 210(1)-(N) are each configured to receive a first voltage signal P1 and a configurable voltage signal P12. In response to a value of the respective input signal IN1-INN, the drivers 210(1)-(N) are each configured to provide the respective output signals OUT1-OUTN signals having voltage levels based on the voltage levels of the voltage signals P1 and P12.

The switching circuit 220 may be configured to receive the P1 voltage signal, a second voltage signal P2, and a control signal, and is configured to provide the P12 voltage signal having a voltage based on the P1 voltage signal, the P2 voltage signal, and the control signal. In some examples, the P1 voltage is less than the P2 voltage. The P1 voltage may be 1 V in some examples, and the P2 voltage may be 1.3 V in some examples. For example, the switching circuit 220 is configured to provide the P12 voltage signal having a voltage of the P1 voltage signal in response to the control signal having a first value and is configured to provide the P12 voltage signal having a voltage of the P2 voltage signal in response to the control signal having a second value. Generally, the control signal is set to a first logical value while the input signals IN1-INN are set to a low logical value and is set to the second logical value while the input signals IN1-INN are set to a high logical value. In some examples, the control signal transitions may closely (e.g., contemporaneously) track transitions of the input signals IN1-INN. In other examples, transitions of the control signal may be offset from transitions of the input signals IN1-INN. For example, when the input signals transition to a low logical value, the control signal may transition before transition of the input signals IN1-INN, and when the input signals transition to a high logical value, the control signal may transition after transition of the input signals IN1-INN. The transition offsets may allow for stepped level changes of the output signals OUT1-OUTN (e.g., stepping from a reference voltage to the P1 voltage signal level using the P1 voltage signal and then stepping from the P1 voltage signal level to the P2 voltage signal level using the P2 voltage signal), which may be more power efficient if the P1 voltage signal is more efficient to generate than the P2 power signal. In some examples, the switching circuit 220 may include a level shifter circuit configured to control the P12 signal in response to the control signal.

In operation, the voltage shift driver circuitry 200 is configured to drive the set of output signals OUT1-OUT2 based on values of the set of input signals IN1-IN2. In some examples, all of the input signals IN1-IN2 have the same value and all of the output signals OUT1-OUT2 have the same value. In some examples, the input signals IN1-IN2 may contemporaneously transition from a first logical value to a second logical value. Based on the transition of the input signals IN1-IN2, the switching circuit 220 and the driver circuits 204 may initiate transition of the output signals OUT1-OUTN from the first logical value to the second logical value. As previously discussed, the transition of the input signals IN1-INN may also affect a transition of the control signal. In some examples, the transition of the control signal may be contemporaneous with transition of the input signals IN1-INN. In another example, the transition of the control signal may be offset from transition of the input signals IN1-INN In response to transition of the control signal, the switching circuit 220 may transition the P12 voltage signal from a first value (e.g., one of the P1 voltage or the P2 voltage) to a second value (e.g., the other of the P1 voltage or the P2 voltage). In some examples, the control signal may control a level shifter of the switching circuit 220 to enable the transition from the first value to the second value.

Responsive to a value of the P12 signal and responsive to values of the input signals IN1-INN, the drivers 210(1)-(N) may transition a respective one of the output signals OUT1-OUTN from the first logical value to the second logical value. If the transition of the control signal is offset from the transition of the input signals IN1-INN, the output signals OUT1-OUTN may initially step (e.g., up or down) to the P1 voltage signal level before stepping to the second logical value (e.g., either a reference voltage level or the P2 voltage signal level). If the transition of the control signal is contemporaneous with the transition of the input signals IN1-INN, the output signals OUT1-OUTN may transition directly to the second logical value (e.g., a reference voltage level or the P2 voltage signal level). In some examples, the drivers 210(1)-(N) may include a pair of serially-coupled inverters configured to receive the respective input signal IN1-INN at an input of a first inverter and provide the respective output signal OUT1-OUTN from an output of the second inverter. The drivers 210(1)-(N) having serially-coupled inverters may be more space and power efficient than driver circuits that include voltage level shifter circuits.

FIG. 3 is a circuit diagram of voltage shift driver circuitry 300 configured to shift voltage levels of output signals in accordance with an embodiment of the present disclosure. The switching circuit(s) 131 and the driver circuits 132 and/or the switching circuit(s) 141 and the driver circuits 142 of FIG. 1 and/or the voltage shift driver circuitry 200 of FIG. 2 may implement the voltage shift driver circuitry 300, in some examples. The voltage shift driver circuitry 300 may include a driver circuits 304 coupled to a switching circuit 320.

The driver circuits 304 includes individual drivers 310(1)-(N). The drivers 310(1)-(N) are each configured to receive a respective one of the input signals IN1-INN and to provide a respective one of the output signals OUT1-OUTN. Voltage levels of the input signals IN1-IN and the output signals OUT1-OUTN may be different in some examples. Each of the drivers 310(1)-(N) includes a respective fast inverter 311(1)-(N) coupled in series with a respective second inverter 312(1)-(N). Each of the first inverters 311(1)-(N) includes a p-type transistor coupled in series with an n-type transistor. The p-type transistor is coupled between the P1 voltage signal and an output node and the n-type transistor is coupled between the output node and a reference voltage node. In response to a respective input signal IN1-INN, each of the first inverters 311(1)-(N) are configured to provide a respective inverted signal SIG1-SIGN. Each of the second inverters 312(1)-(N) includes a p-type transistor coupled in series with an n-type transistor. The p-type transistor is coupled between the P12 voltage signal and an output node and the n-type transistor is coupled between the output node and a reference voltage node. In response to a respective inverted signal SIG1-SIGN, each of the second inverters 312(1)-(N) are configured to provide a respective output signal OUT1-OUTN. Because the inverters are in parallel, the logical values of the input signals IN1-INN match the logical values of the output signals OUT1-OUTN. In some examples, based on the difference in the P1 and P12 voltage signals received at the first inverters 311(1)-(N) and the second inverters 312(1)-(N), respectively, the voltage level of the input signals IN1-INN may be different than the voltage levels of the output signals OUT1-OUTN.

The switching circuit 320 may be configured to receive the P1 voltage signal, a second voltage signal P2, and a control signal, and is configured to provide the P12 voltage signal having a voltage based on the P1 voltage signal, the P2 voltage signal, and the control signal. In some examples, the P1 voltage is less than the P2 voltage. The P1 voltage may be 1 V in some examples, and the P2 voltage may be 1.3 V in some examples. The switching circuit 320 may include a 321 and a 326 coupled in parallel to an output node providing the P12 signal. The 321 and the 326 may include p-type transistors, in some examples. The 321 may be coupled between the P1 voltage and the output node providing the P12 signal. The 326 may be coupled between the P2 voltage and the output node providing the P12 signal. The switching circuit 320 may further include a 330. The 330 may provide a level shift signal LS to a gate of the 321 and to a gate of the 326 via an inverter 322 having a value based on a logical value of a control signal. The inverter 322 may be coupled to the P2 power signal to control the 326.

Generally, the control signal is set to a first logical value while the input signals IN1-INN are set to a low logical value and is set to a second logical value when while the input signals IN1-INN are set to a high logical value. In some examples, the control signal transitions may closely (e.g., contemporaneously) track transitions of the input signals IN1-INN. In other examples, transitions of the control signal may be offset from transitions of the input signals IN1-INN. For example, when the input signals transition to a low logical value, the control signal may transition before transition of the input signals IN1-INN, and when the input signals transition to a high logical value, the control signal may transition after transition of the input signals IN1-INN. The transition offsets may allow for stepped level changes of the output signals OUT1-OUTN (e.g., stepping from a reference voltage to the P1 voltage signal level using the P1 voltage signal and then stepping from the P1 voltage signal level to the P2 voltage signal level using the P2 voltage signal), which may be more power efficient if the P1 voltage signal is more efficient to generate than the P2 power signal. In some examples, the LS signal may be logically equal to the control signal. Therefore, in response to the control signal having a first logical value (e.g., a low logical value), the LS signal may have the first logical value, and in response to the LS signal having the first logical value, the 321 signal may provide the P1 voltage to the P12 voltage signal and the 326 may be disabled (based on the output of the inverter 322). In response to the control signal having a second logical value (e.g., a low logical value), the LS signal may have the second logical value, and in response to the LS signal having the second logical value, the 321 signal may be disabled and the 326 may provide the P2 voltage to the P12 voltage signal (based on the output of the inverter 322).

By including the 330 in the switching circuit 320, rather than in each of the drivers 310(1)-(N), the voltage shift driver circuitry 300 may include fewer circuit components, which makes the voltage shift driver circuitry 300 my space efficient and power efficient.

FIG. 4 is a circuit diagram of voltage level shifter circuit 400 in accordance with an embodiment of the present disclosure. The switching circuit(s) 131 and/or the switching circuit(s) 141 of FIG. 1, the switching circuit switching circuit 230 of FIG. 2, and/or the 330 of FIG. 3 may implement the voltage level shifter circuit 400 of FIG. 4. The voltage level shifter circuit 400 is configured to receive a control signal and to provide a level shift signal LS based on the control signal. The level shift circuit 400 includes a pair of cross-coupled transistors 401 and 402, a transistor coupled in series with the transistor 401, and a transistor 404 coupled in series with the transistor 402. The level shift circuit 400 further includes an inverter (serially-coupled transistors 405 and 406). The transistors 401, 402, and 405 may include p-type transistors. The transistors 403, 404, and 406 may include n-type transistors. The transistors 401 and 402 may be driven by the P2 voltage signal, and the transistor 405 may be driven by the P1 power signal.

The transistor 403 and the inverter (serially-coupled transistors 405 and 406) are each configured to receive the control signal. The inverter (serially-coupled transistors 405 and 406) may invert a logical value of the control signal to provide an output signal to the gate of the transistor 404. The LS signal is provided from a node between the transistors 402 and 404.

In operation, in response to the control signal having a high logical value, the output of the inverter (serially-coupled transistors 405 and 406) may have a low logical value and the transistor 403 may be enabled. in response to the transistor 403 being enabled, the node between the transistors 401 and 403 may be pulled to a low logical value. In response to the node between the transistors 401 and 403 transitioning the low logical value, the transistor 402 may be enabled to provide a high logical value (e.g., the P2 voltage signal) to the node between the transistors 402 and 404. In response to the node between the transistors 402 and 404 transitioning the high logical value, the transistor 401 may be disabled. The LS signal having the high logical value is provided from the node between the transistors 402 and 404.

In response to the control signal having a low logical value, the output of the inverter (serially-coupled transistors 405 and 406) may have a high logical value (e.g., the P1 voltage signal) and the transistor 403 may be disabled. In response to the inverter (serially-coupled transistors 405 and 406) having the high logical value (e.g., the P1 voltage signal), the transistor 404 may be enabled. In response to the transistor 404 being enabled, the node between the transistors 402 and 404 may be pulled to a low logical value. In response to the node between the transistors 402 and 404 transitioning the low logical value, the transistor 401 may be enabled to provide a high logical value (e.g., the P2 voltage signal) to the node between the transistors 401 and 403. In response to the node between the transistors 401 and 403 transitioning the high logical value, the transistor 402 may be disabled. The LS signal having the low logical value is provided from the node between the transistors 402 and 404.

Figure 5:
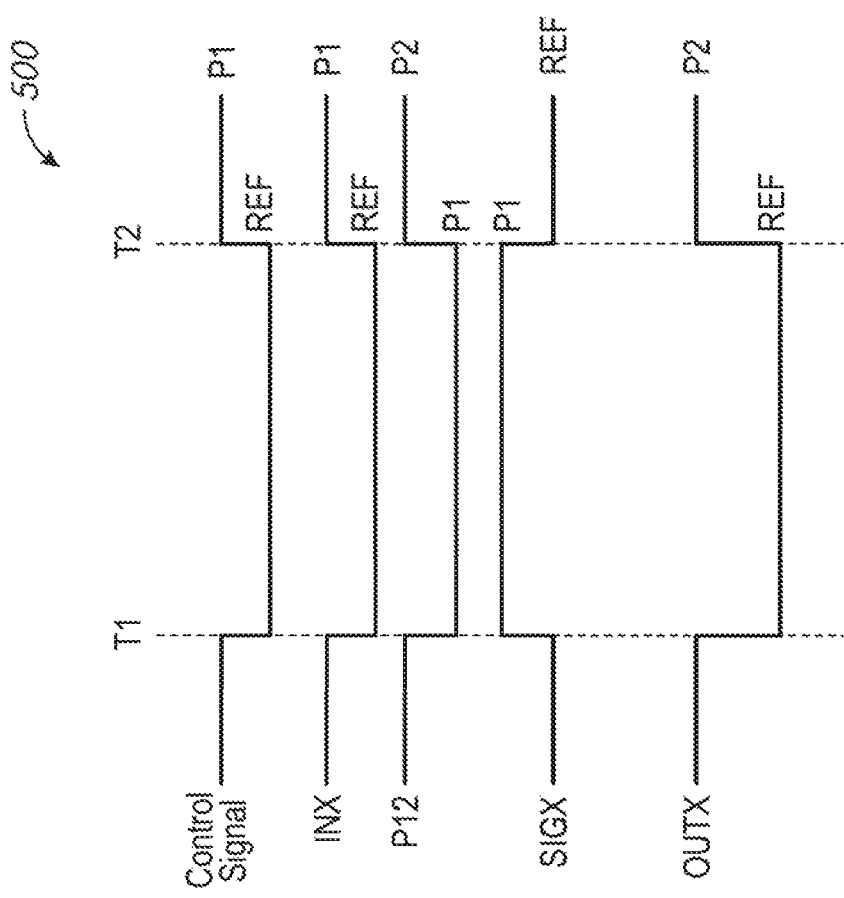
FIG. 5 is an exemplary timing diagram 500 depicting operation of a driver circuit and a switching circuit in accordance with embodiments of the disclosure.

FIG. 5 is an exemplary timing diagram 500 depicting operation of a driver circuit and a switching circuit in accordance with embodiments of the disclosure. In some examples, the timing diagram 500 may depict operation of a portion of the switching circuit(s) 131 and driver circuits 132 and/or the switching circuit(s) 141 and driver circuits 142 of FIG. 1, the voltage shift driver circuitry 200 of FIG. 2, and/or the voltage shift driver circuitry 300 of FIG. 3. The input signal INX signal and the output signal OUTX may correspond to any of the input signals IN1-INN and any of the output signals OUT1-OUTN of FIGS. 2 and 3. The inverted signal SIGX signal may correspond to any of the inverted signals SIG1-SIGN of FIG. 3. The P1, P2, and P12 voltage signals may correspond to the P1, P2, and P12 signals for FIGS. 2 and 3.

In the timing diagram 500, prior to time T1, the input signal INX has a high logical value equal to the P1 voltage signal level, the inverted signal SIGX has a low logical value (e.g., input signal INX inverted via one of the inverters 311(1)-(N) driven by the P1 voltage signal), the P12 voltage signal is set to the P2 voltage signal level (e.g., via the switching circuit switching circuit 220 and/or switching circuit 320 of FIGS. 2 and/or 3 respectively), and the output signal OUTX has a high logical value equal to the P2 voltage signal level (e.g., the inverted signal SIGX inverted via one of the inverters 312(1)-(N) and based on the P12 voltage signal having the P2 voltage signal level).

At time T1, the input signal IN1 transitions to a low logical value. In response to the input signal IN1 transitioning to the low logical value, the inverted signal SIGX transitions to a high logical value having the P1 voltage signal level (e.g., input signal INX inverted via one of the inverters 311(1)-(N)), the P12 voltage signal transitions to the P1 voltage signal level (e.g., via the switching circuit switching circuit 220 and/or switching circuit 320 of FIGS. 2 and/or 3 respectively), and the output signal OUTX transitions to the low logical value (e.g., the inverted signal SIGX inverted via one of the inverters 312(1)-(N)).

Between time T1 and T2, the input signal INX has the low logical value, the inverted signal SIGX has the high logical value high logical value having the P1 voltage signal level (e.g., input signal INX inverted via one of the inverters 311(1)-(N) driven by the P1 voltage signal), the P12 voltage signal is set to the P1 voltage signal level (e.g., via the switching circuit switching circuit 220 and/or switching circuit 320 of FIGS. 2 and/or 3 respectively), and the output signal OUTX has the low logical value (e.g., the inverted signal SIGX inverted via one of the inverters 312(1)-(N) and based on the P12 voltage signal having the P2 voltage signal level).

At time T2, the input signal IN1 transitions the high logical value equal to the P1 voltage signal level. In response to the input signal IN1 transitioning to the high logical value, the inverted signal SIGX transitions to the low logical value (e.g., input signal INX inverted via one of the inverters 311(1)-(N)), the P12 voltage signal transitions to the P2 voltage signal level (e.g., via the switching circuit switching circuit 220 and/or switching circuit 320 of FIGS. 2 and/or 3 respectively), and the output signal OUTX transitions to the high logical value equal to the P2 voltage signal level (e.g., the inverted signal SIGX inverted via one of the inverters 312(1)-(N) and based on the P12 voltage signal having the P2 voltage signal level).

Figure 6:
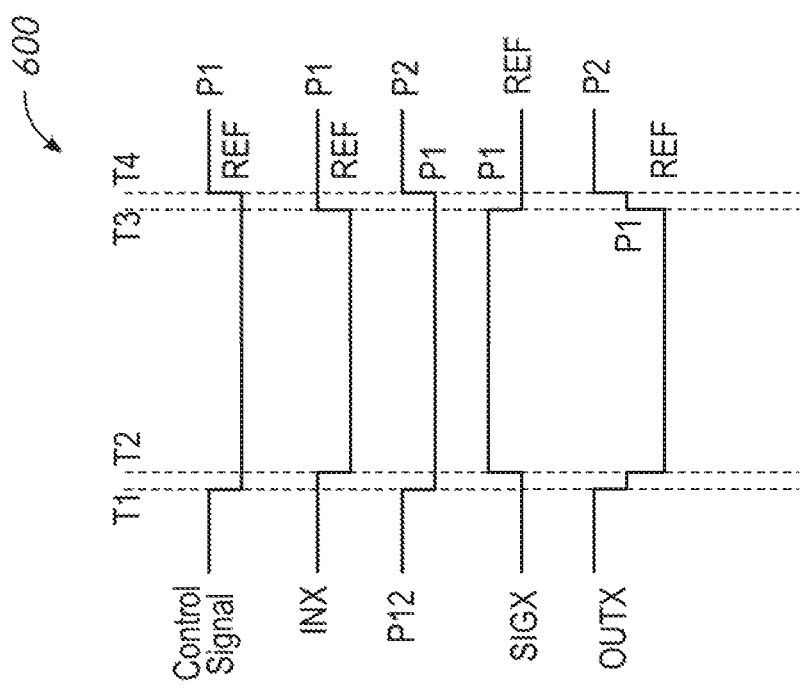
FIG. 6 is an exemplary timing diagram 600 depicting operation of a driver circuit and a switching circuit implementing stepped transitions of an output signal in accordance with embodiments of the disclosure.

FIG. 6 is an exemplary timing diagram 600 depicting operation of a driver circuit and a switching circuit implementing stepped transitions of an output signal in accordance with embodiments of the disclosure. In some examples, the timing diagram 600 may depict operation of a portion of the switching circuit(s) 131 and driver circuits 132 and/or the switching circuit(s) 141 and driver circuits 142 of FIG. 1, the voltage shift driver circuitry 200 of FIG. 2, and/or the voltage shift driver circuitry 300 of FIG. 3. The input signal INX signal and the output signal OUTX may correspond to any of the input signals IN1-INN and any of the output signals OUT1-OUTN of FIGS. 2 and 3. The inverted signal SIGX signal may correspond to any of the inverted signals SIG1-SIGN of FIG. 3. The P1, P2, and P12 voltage signals may correspond to the P1, P2, and P12 signals for FIGS. 2 and 3.

In the timing diagram, prior to time T1, the input signal INX has a high logical value equal to the P1 voltage signal level, the inverted signal SIGX has a low logical value (e.g., input signal INX inverted via one of the inverters 311(1)-(N) driven by the P1 voltage signal), the P12 voltage signal is set to the P2 voltage signal level (e.g., via the switching circuit switching circuit 220 and/or switching circuit 320 of FIGS. 2 and/or 3 respectively), and the output signal OUTX has a high logical value equal to the P2 voltage signal level (e.g., the inverted signal SIGX inverted via one of the inverters 312(1)-(N) and based on the P12 voltage signal having the P2 voltage signal level).

At time T1, the control signal transitions to a low logical value equal to the P1 voltage signal level. In response to the control signal transitioning to the low logical value, the P12 voltage signal transitions to the P1 voltage signal level (e.g., via the switching circuit switching circuit 220 and/or switching circuit 320 of FIGS. 2 and/or 3 respectively). In response to the P12 voltage signal transitioning to the P1 voltage signal level, the output signal OUTX transitions to the P1 voltage signal level (e.g., the inverted signal SIGX inverted via one of the inverters 312(1)-(N), where the inverters switch from being driven by the P2 voltage signal level to being driven by the P1 voltage signal level).

At time T2, the input signal IN1 transitions to a low logical value. In response to the input signal IN1 transitioning to the low logical value, the inverted signal SIGX transitions to a high logical value having the P1 voltage signal level (e.g., input signal INX inverted via one of the inverters 311(1)-(N)), and the output signal OUTX transitions to the low logical value (e.g., the inverted signal SIGX inverted via one of the inverters 312(1)-(N)).

Between time T2 and T3, the input signal INX has the low logical value, the inverted signal SIGX has the high logical value high logical value having the P1 voltage signal level (e.g., input signal INX inverted via one of the inverters 311(1)-(N) driven by the P1 voltage signal), the P12 voltage signal is set to the P1 voltage signal level (e.g., via the switching circuit switching circuit 220 and/or switching circuit 320 of FIGS. 2 and/or 3 respectively), and the output signal OUTX has the low logical value (e.g., the inverted signal SIGX inverted via one of the inverters 312(1)-(N) and based on the P12 voltage signal having the P2 voltage signal level).

At time T3, the input signal IN1 transitions the high logical value equal to the P1 voltage signal level. In response to the input signal IN1 transitioning to the high logical value, the inverted signal SIGX transitions to the low logical value (e.g., input signal INX inverted via one of the inverters 311(1)-(N)), and the output signal OUTX transitions to the high logical value equal to the P1 voltage signal level (e.g., the inverted signal SIGX inverted via one of the inverters 312(1)-(N) and based on the P12 voltage signal having the P1 voltage signal level).

At time T4, the control signal transitions to the high logical value equal to the P2 voltage signal level. In response to the control signal transitioning to the high logical value, the P12 voltage signal transitions to the P2 voltage signal level (e.g., via the switching circuit switching circuit 220 and/or switching circuit 320 of FIGS. 2 and/or 3 respectively). In response to the P12 voltage signal transitioning to the P2 voltage signal level, the output signal OUTX transitions to the P2 voltage signal level (e.g., the inverted signal SIGX inverted via one of the inverters 312(1)-(N), where the inverters switch from being driven by the P1 voltage signal level to being driven by the P1 voltage signal level).

As shown in the timing diagram 600 of FIG. 6, the output signal uses stepped transitions of the output signal OUTX. Stepped transitions may be desirable when the P1 voltage signal a more efficient voltage signal to generate. That is, in some instances, one internal voltage signal may require voltage pumps or other additional circuitry generate the internal voltage signal while another internal voltage signal may be produced using a voltage divider. Therefore, in an example where the P1 voltage signal is more efficient to generate than the P2 voltage signal, using the P1 voltage signal to step the output signal OUTX from a reference voltage to the P1 voltage signal level before using the P2 voltage signal to transition the output signal OUTX to the P2 voltage signal level may be more power efficient than using the P2 voltage signal to transition the output signal OUTX directly from the reference voltage to the P2 voltage signal level.

The timing diagrams 500 and 600 are exemplary for illustrating operation of various described embodiments. Although the timing diagrams 500 and 600 depicts a single pair of transitions of the included signals, one of skill in the art will appreciate that additional transitions may be included without departing from the scope of the disclosure. Further, the depiction of a magnitude of the signals represented in the timing diagrams 500 and 600 are not intended to be to scale, and the representative timing is an illustrative example of a timing characteristics.

Although the detailed description describes certain preferred embodiments and examples, it will be understood by those skilled in the art that the scope of the disclosure extends beyond the specifically disclosed embodiments to other alternative embodiments and/or uses of the embodiments and obvious modifications and equivalents thereof. In addition, other modifications which are within the scope of the disclosure will be readily apparent to those of skill in the art. It is also contemplated that various combination or sub-combination of the specific features and aspects of the embodiments may be made and still fall within the scope of the disclosure. It should be understood that various features and aspects of the disclosed embodiments can be combined with or substituted for one another in order to form varying mode of the disclosed embodiments. Thus, it is intended that the scope of at least some of the present disclosure should not be limited by the particular disclosed embodiments described above.

What is claimed is:

1. A voltage shift driver circuity of a semiconductor device comprising:
    a plurality of driver circuits each configured to receive a respective input signal, a first voltage signal, and a configurable voltage signal, wherein, while the respective input signal have a first logical value, the plurality of driver circuits are configured to provide respective output signals having the first logical value and while the respective input signals has a second logical value, the plurality of driver circuits are configured to provide the respective output signals having the second logical value, wherein voltage levels of the respective input signals having the first logical value are based on the first voltage signal and voltage levels the respective output signals having the first logical value are based on the configurable voltage signal, and wherein the voltage levels of the respective input signals having the second logical value and the voltage levels of the respective output signals having the second logical value are each based on a reference voltage signal;
    a switching circuit configured to receive the first voltage signal and a second voltage signal and to provide the configurable voltage signal having a voltage level of one of the first voltage signal or the second voltage signal.

2. The voltage shift driver circuity of the semiconductor device of claim 1, wherein a driver circuit of the plurality of driver circuits comprises:
    a first inverter configured to receive the respective input signal and to provide a respective inverted signal having a logically inverted value of the respective input signal, wherein the first inverter is coupled between a node receiving the first power signal and a node receiving the reference voltage signal; and
    a second inverter coupled in series with the first inverter and configured to receive the respective inverted signal and to provide a respective output signal having a logically inverted value of the respective inverted signal, wherein the second inverter is coupled between a node receiving the configurable voltage signal and a node receiving the reference voltage signal.

3. The voltage shift driver circuity of the semiconductor chip of claim 2, wherein the first inverter comprises a first transistor coupled in series with a second transistor between the node receiving the first voltage signal and the node receiving the second voltage signal.

4. The voltage shift driver circuity of the semiconductor chip of claim 2, wherein the switching circuit comprises a voltage level shift circuit configured to provide a level shift signal based on a value of a control signal, wherein the value of the control signal is based on a value of the input signal.

5. The voltage shift driver circuity of the semiconductor chip of claim 2, wherein the voltage level shift circuit comprises:
    a first transistor coupled between a first node receiving the second voltage signal and a second node, wherein a gate of the first transistor is coupled to a third node;
    a second transistor coupled between the second node and a fourth node receiving the reference voltage signal, wherein a gate of the second transistor is configured to receive the control signal;
    a third transistor coupled between a fifth node receiving the second voltage signal and the third node, wherein a gate of the third transistor is coupled to the second node, wherein the level shift signal is provided from the third node; and
    a fourth transistor coupled between the third node and the fourth node, wherein a gate of the second transistor is configured to receive an inverted control signal.

6. The voltage shift driver circuity of the semiconductor chip of claim 5, wherein the voltage level shift circuit further comprises an inverter configured to receive the control signal and to provide the inverted control signal to the gate of the fourth transistor.

7. The voltage shift driver circuity of the semiconductor chip of claim 4, wherein the switching circuit further comprises:
    a first transistor configured to receive the level shift signal and to provide the first voltage signal as the configurable voltage signal responsive to the level shift signal having the second logical value; and
    a second transistor configured to receive a logically inverted level shift signal and to provide the second voltage signal as the configurable voltage signal responsive to the level shift signal having the first logical value.

8. The voltage shift driver circuity of the semiconductor chip of claim 7, wherein the first transistor and the second transistors are p-type transistors.

* * * * *